(12) United States Patent
Miczo

(10) Patent No.: US 7,761,828 B2
(45) Date of Patent: Jul. 20, 2010

(54) PARTITIONING ELECTRONIC CIRCUIT DESIGNS INTO SIMULATION-READY BLOCKS

(75) Inventor: Alexander Miczo, Mt. View, CA (US)

(73) Assignee: Partition Design, Inc., Brooklyn, NY (US)

(*) Notice: Subject to any disclaimer, the term of this patent is extended or adjusted under 35 U.S.C. 154(b) by 437 days.

(21) Appl. No.: 11/840,175

(22) Filed: Aug. 16, 2007

(65) Prior Publication Data
US 2008/0046851 A1 Feb. 21, 2008

Related U.S. Application Data

(60) Provisional application No. 60/838,944, filed on Aug. 18, 2006.

(51) Int. Cl.
*G06F 17/50* (2006.01)
*G06F 13/10* (2006.01)

(52) U.S. Cl. ............... 716/7; 716/4; 716/5; 716/6; 716/18; 703/13; 703/14; 703/19; 703/20

(58) Field of Classification Search ............... 716/1, 716/4–7, 18; 703/13, 14, 19, 20, 22
See application file for complete search history.

(56) References Cited

U.S. PATENT DOCUMENTS

| | | | |
|---|---|---|---|
| 6,311,309 B1* | 10/2001 | Southgate | 716/1 |
| 6,754,763 B2* | 6/2004 | Lin | 710/317 |
| 7,366,652 B2* | 4/2008 | Wang et al. | 703/28 |
| 7,512,728 B2* | 3/2009 | Tseng | 710/100 |
| 2002/0133325 A1* | 9/2002 | Hoare et al. | 703/17 |
| 2008/0243462 A1* | 10/2008 | Guenther et al. | 703/15 |
| 2009/0150136 A1* | 6/2009 | Yang | 703/13 |

OTHER PUBLICATIONS

Cong et al.; "Physical planning with retiming"; Nov. 5-9, 2000; Computer Aided Design, 2000. ICCAD-2000. IEEE/ACM International Conference on; pp. 2-7.*
Miczo et al.; ("A Self-Test Hardwired Control Section"); Jul. 1983 Computers, IEEE Transactions on; vol. C-32, Issue 7, pp. 695-696).*
Miczo; "VHDL as a modeling-for-testability tool"; Feb. 26-Mar. 2, 1990; Compcon Spring '90. 'Intellectual Leverage'. Digest of Papers. Thirty-Fifth IEEE Computer Society International Conference; pp. 403-409.*
Miczo et al.; " Functional test using behavior models"; Feb. 24-28, 1992; Compcon Spring '92. Thirty-Seventh IEEE Computer Society International Conference, Digest of Papers; pp. 446-451.*

* cited by examiner

*Primary Examiner*—Helen Rossoshek
(74) *Attorney, Agent, or Firm*—Joseph E. Levi, Esq.

(57) ABSTRACT

A partitioning method for an integrated circuit (IC) design includes providing a textual file representing the design as library-specific cells and interconnections, including timing data for the cells and timing data derived from the design after placement and routing. The design is flattened to cell level. Edge-triggered flip-flops (ETFF's) are selected and divided into two groups by communications attributes. First group is subdivided into the number of subsets in the partition. The ETFF's in each subset are analyzed by their communications attributes, and divided into those that connect to circuit elements outside the particular subset, and those that do not, reducing intersubset communications and placing them under external clock control. The partition is electrically equivalent to the design. The design is simulated by placing each subset on its own computer with simulator software. The computers are interconnected. User interventions may be allowed. Results from simulations are collected, merged, and presented.

1 Claim, 9 Drawing Sheets

A Partition of Subsets

Figure 1:
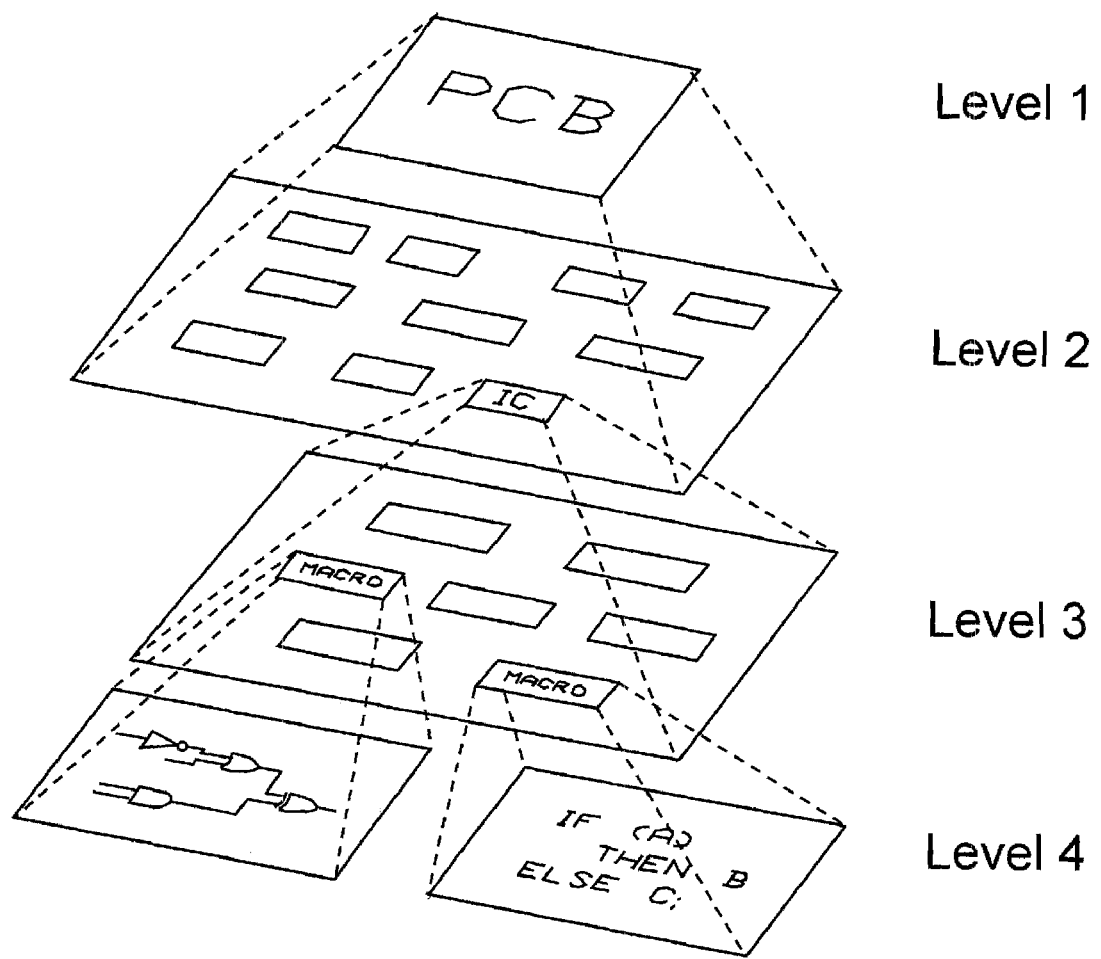

Figure 1: Design Hierarchy

Figure 2:
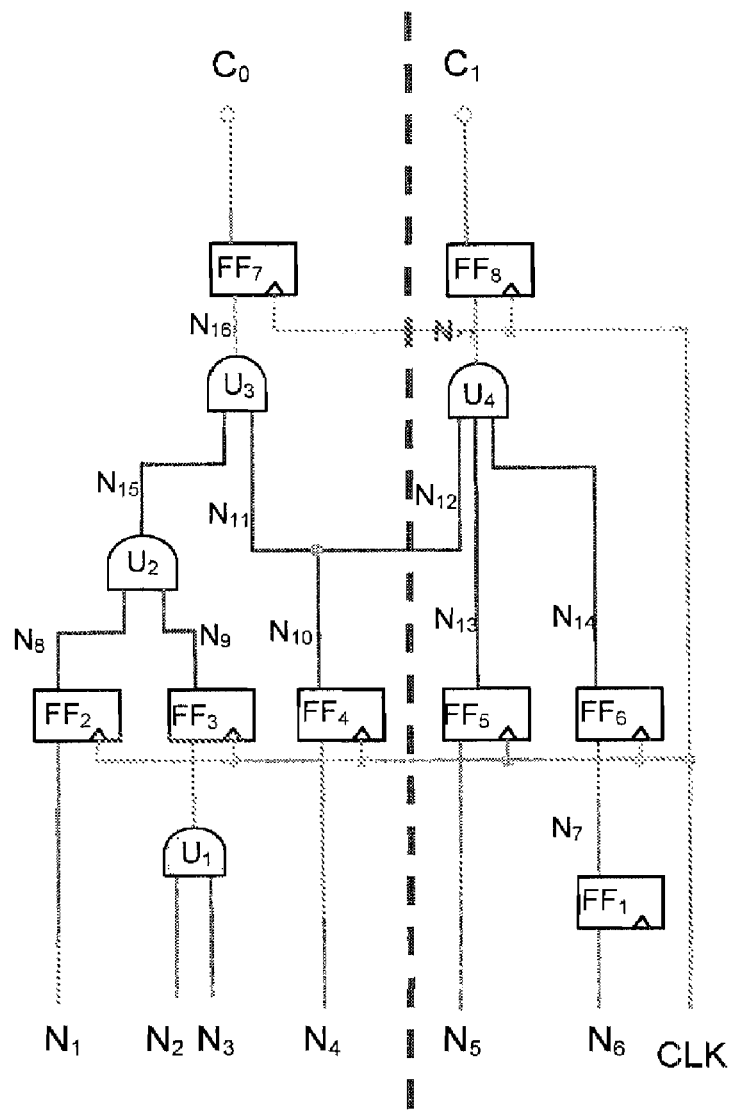

Figure 2: Vertical Partition

Figure 3:
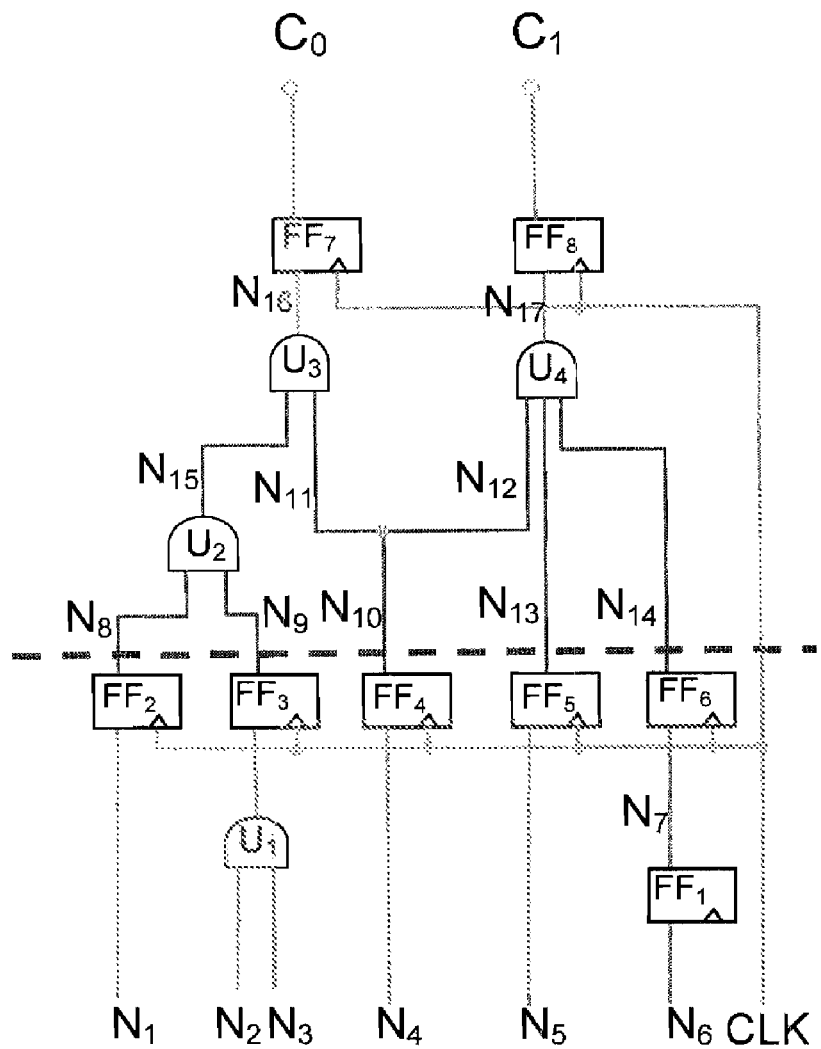

Figure 3: Horizontal Partition

Figure 4: The Fence

Figure 5: Backtrace

Figure 7:
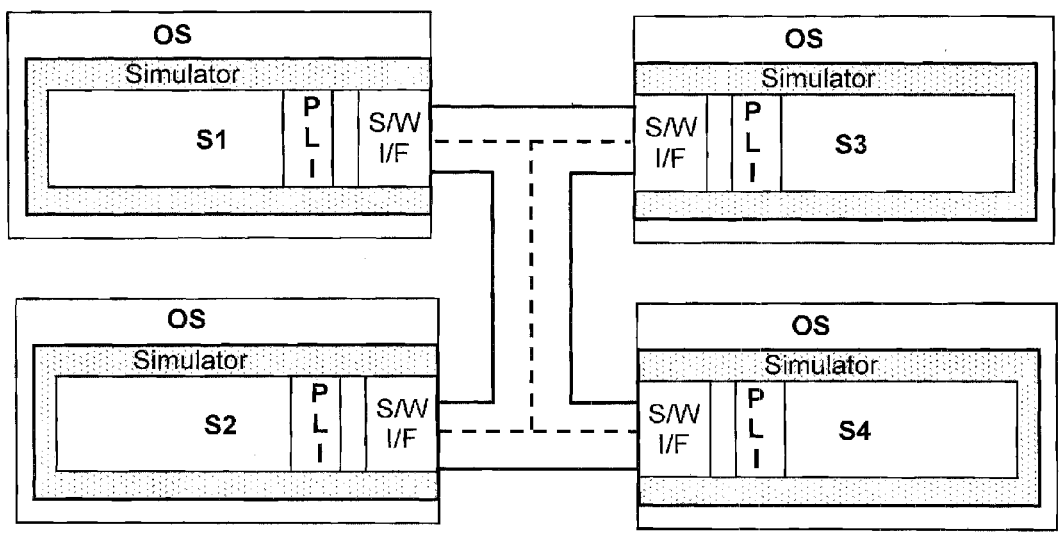

Figure 7: A Partition of Subsets

PARTITIONING ELECTRONIC CIRCUIT DESIGNS INTO SIMULATION-READY BLOCKS

CROSS-REFERENCE TO RELATED APPLICATION

This application claims priority benefit of provisional U.S. patent application Ser. No. 60/838,944, entitled PARTITIONING ELECTRONIC CIRCUIT DESIGNS INTO SIMULATION-READY SUBSETS, filed on Aug. 18, 2006, which application is hereby incorporated by reference in its entirety, including all Figures, Tables, and Claims.

FIELD OF THE INVENTION

This invention relates generally to electronic design automation (EDA) systems used for designing complex integrated circuits (IC's). The invention is specifically related to a method of partitioning electronic integrated circuit designs, incorporating cell and device level timing data, producing subsets optimized for simulation speed.

BACKGROUND

Software simulators have long been used to verify the correct behavior of electronic circuit designs. As a result of Moore's Law, IC design size and complexity have continuously outpaced the capabilities to perform the desired simulations. Using current methods, it can take an impractical amount of time to perform desired simulations of large circuit designs, especially when including the detailed timing information needed for a comprehensive simulation. The more thorough the simulations, the better the chance the new IC device will succeed in manufacturing, thus the industry has a constant dilemma of how much time to spend simulating versus time-to-market considerations.

IC designers often employ hierarchical design techniques to determine the appropriate selection and interconnection of logic and/or memory devices which enable the IC to perform a desired function. These techniques involve describing the IC's functionality at various levels of abstraction, ranging from the most general function performed by the IC to the precise functions performed by each logic and/or memory element on the device. Encoding the design in a hardware description language (HDL) such as Verilog or VHDL is the usual design entry technique used to specify modern IC's. HDLs represent electronic operations as a sequence of statements in software coding. At this high level of abstraction the circuit design is represented by its "netlist," which is "a textual file representing an ASIC design as a set of library-specific cells along with their interconnections" (EDA Consortium Glossary). It is possible to determine the functionality of the circuit design netlist as it exists in software, using such tools as behavioral simulators and static timing verifiers, but it may not be possible at this stage to include the detailed real-world models of the targeted integrated circuit manufacturing process.

The next stage in the design process is logic synthesis, in which design software takes the HDL description of the circuit design and creates the actual electronic functions ("gates" or "cells") which are to be fabricated on the integrated circuit. During synthesis the design is "targeted" at a given integrated circuit manufacturing process, by incorporating timing and other detailed information contained in standard cell libraries that characterize the intended silicon manufacturing process technology. A cell library is a database containing detailed specifications of the characteristics of each logical component available for use in a given IC fabrication process, and thus to the designer. Synthesis and incorporation of timing data cause a large increase in the size of the data representing the circuit design, compared to the pre-synthesis netlist, which causes the simulation run-time to greatly increase. With modern large designs, this can result in simulation run-times of days and weeks, creating a demand for methods of speeding up simulation. The synthesis-simulation steps are performed repeatedly: as simulation detects errors in functionality or timing, the circuit design must be corrected and re-synthesized, and re-simulated, iteratively. The result is a logic design database which completely specifies the logical and functional relationships among the components of the design, and is used to perform placement and routing (layout) of the design's components on the integrated circuit chip.

Placement and routing determines where the actual devices are placed on the integrated circuit, and how the electrical connections are made. These decisions determine how the integrated circuit will actually perform once fabricated, especially the timing performance, making it desirable to extract the timing information from the physical design and perform post-layout simulations with timing. A primary motivation for the invention is to allow these simulations to be performed in a much shorter period of time than is available with current methods of simulation in software.

"Partitioning" may be described as a process whereby a circuit design is decomposed into smaller subcircuits, such that the subcircuits are electrically equivalent to the design being partitioned. "Electrically equivalent" means the simulation output results from running the entire circuit on a single computer (processor) are the same as running the partition subsets on individual (networked) computers, i.e., simulation-invariant. Such decomposition into subsets is called a partition of the design. The purpose of creating a partition is to permit the simulation task to be shared among two or more computers, thereby accomplishing simulation computations in less time than would be required if the entire simulation task were to be performed on a single computer.

Current methods of partitioning a large circuit design require substantial manual effort by skilled circuit designers, are generally incapable of delivering meaningful simulation speed ups, or are methods that place severe limitations on the nature of the input design. A problem inherent in simulating a design as a partition of subsets on many networked computers is the communications "overhead" that exists. Each subset needs to communicate with every other subset: for the "next" simulation step to start, each subset needs to receive its new inputs and transmit its current outputs to the other subsets.

A common method of partitioning is to divide the input design into functional blocks ("partitioning along functional boundaries"). This is often not difficult to do, but may not result in a partition that is suitable for simulation: depending on the design, the block sizes may vary by a large factor and may need further partitioning, and the communications between blocks may become extremely time consuming, i.e., communications "blow-up."

For circuit designs with multiple clocks, a common method is to partition the circuit along its clock boundaries, as referenced in Khalil et al., U.S. Pat. No. 7,039,887; Baumgartner, U.S. Pat. No. 6,567,962; and Ruediger, U.S. Pat. No. 6,523,155. A complex circuit may have a single clock, in which case this method may not be applicable. Also, this method may not produce the desired number or type of partitions, or it may produce partitions not suitable for simulation, e.g., having too much communications overhead to be effective.

Another common method is partitioning along hierarchical boundaries is described in Zhou el al., U.S. Pat. No. 6,807,520; and Gutwin et al., U.S. Pat. No. 6,588,000; and conceptually illustrated in FIG. 1. Partitioning along hierarchical boundaries generally will not produce a desirable partition for the purposes of simulation, especially cell level simulation with timing included.

Many patents describe methods of partitioning circuits described at a high level of abstraction, e.g., as state machines for formal verification in Baumgartner, U.S. Pat. No. 6,553,514; at RTL level as described in Johannsen, U.S. Pat. No. 6,728,939; or as Boolean decision diagrams described in Jain et al., U.S. Pat. No. 7,028,278. These abstract representations cannot utilize the "real-world" timing data provided by the cell library of the target fabrication process, and the timing information derived after placement and routing, and are thus not suitable for dynamic simulation.

Some methods of partitioning are used for static analysis and/or functional verification, as referenced in Chopra et al., U.S. Pat. No. 7,047,510; Wever et al., U.S. Pat. No. 7,047,162; Jain et al., U.S. Pat. No. 7,028,278; and McGaughy, U.S. Pat. No. 7,024,652. In a static analysis the timing information is excluded, unlike the current invention.

Some methods of partitioning are optimized for such purposes as fault simulation and automatic test program generation (ATPG), as in Carpenter et al., U.S. Pat. No. 5,862,149. These methods may not be applicable when dynamic timing simulation is desired. The high level of abstraction in each case again disallows incorporation of timing data from the circuit library elements (cells) and the timing information measured after circuit layout.

Several patents describe methods of partitioning digital circuits at the transistor level, for the purposes of simulation, e.g., Khaira et al., U.S. Pat. No. 7,171,347 (transistor level); Shah, U.S. Patent Application Publication No. 20050273298; and Wei, U.S. Pat. No. 6,112,022, which operates on a SPICE netlist.

Existing methods do not apparently offer a general method for partitioning, particularly when timing data is to be included. This may preclude taking full advantage of existing design tools and techniques (e.g., cell level simulation with timing data), leading to insufficient simulation which causes expensive redesigns of new IC products.

SUMMARY

Embodiments of the present invention are novel methods for partitioning that, by construction, may both minimize and control the communications between subsets. Embodiments of the invention may use dynamic (non-static) simulation. Timing information for dynamic simulation may be incorporated. In embodiments, transistor level partitioning is not used.

In embodiments, a method for partitioning electronic integrated circuit designs into simulation-ready blocks is described. The circuit design to be partitioned may be of any size; may have multiple clocks; may contain asynchronous and analog circuitry within it; may be decomposed into any desired number of subsets; may be decomposed into subsets of any desired size; and/or may operate with mixed levels of design hierarchy. The subsets provided may be simulated on different types and brands of simulators, running on different types of computers, which may be controlled by different operating systems.

After partitioning into subsets, the entire circuit design may be simulated by placing each subset of the partition on its own associated computer, each with its own simulator, connected on a network. Each subset receives from the other subsets the logical inputs it needs to perform its own next simulation step. Each subset communicates its logical outputs to the other subsets, providing the new inputs to the receiving subsets. The results from the individual simulations are collected, merged and then presented as if the whole process had occurred on a single simulator running on a single computer.

It is not uncommon for circuits of approximately the same size (i.e., amount of data needed to represent the circuit) to require significantly different amounts of CPU time to complete a simulation. This is a function of the nature and complexity of the circuit. Upon commencing simulation it may be found that one or more subsets exhibit much more activity than other subsets, causing a simulation "load imbalance" that slows the overall simulation performance. In embodiments, the user is allowed/enabled to adjust the size and/or nature of the subsets of the partition, i.e., fine-tune the partition to perform load balancing.

Partitioning of a wide class of electronic systems and devices, in particular, large digital integrated circuits such as ASIC's and systems-on-chip (SOC's), is enabled. Partitioning is performed after IC layout and timing extraction, for the purpose of spreading the simulation workload over many machines, and achieving reduced elapsed simulation time.

Selected methods described provide a partition with particularly desirable characteristics for simulation using many computers on a network. By construction, communications between subsets of the partition are both minimized and placed under external control, avoiding communications "blow-up" (FIG. 2). The method of input and output "periphery extraction" allows the subsets to be tightly integrated with the testbench, without communications blow-up. The deployment of many computers for simulating large designs is allowed, without the communications blow-up that typically degrades such efforts, and thereby reducing elapsed simulation times, and hence provides economic value to the electronics industry.

The described methods may be used with large integrated circuits that are primarily or solely digital and synchronous, with the purpose of performing post-layout simulations with all available timing data. The output may be a partition optimized for simulation, or results of simulation of the optimized partition. To use the partition for simulation, a network of computers, each with its own simulation software, may be provided and configured.

These and other features and aspects of the present invention will be better understood with reference to the following description, drawings, and appended claims.

BRIEF DESCRIPTION OF THE FIGS.

FIG. 1 is an illustration of Electronic Design Hierarchy with four levels of hierarchy shown. Level 1 represents the printed circuit board. Level 4 illustrates how a function can be expressed as a collection of cells, where each cell may be described as a network of logic gates ("gate level") or as a sequence of lines of code, written in a hardware design language (HDL) such as Verilog or VHDL ("behavioral" level or "RTL" level).

FIG. 2 is an illustration of "Vertical" Partition. The wire labeled N10 drives two wire segments labeled N11 and N12. The wire N11 is contained in the left subset, while N12 is in the right subset, as determined by the dashed vertical line. As a result, every time there is a logic event, i.e., a change in value of the signal, on wire N10, that event propagates forward to logic elements in both subsets. In large circuits, there may be many thousands of these boundary crossings, with the result that many thousands of events have to be shared between subsets at every tick of the clock. If the subsets are remote from one another, as when subsets are being simulated on separate host computers, these events have to be transmitted to the subsets residing on the other computers at every tick of the clock, possibly causing serious simulation performance degradation through communications "blow-up."

FIG. 3 is an illustration of "Horizontal" Partition. The partitioning algorithm begins by forming a set of all the edge triggered flip-flops (ETFFs). The figure shows a set of ETFFs is divided into two groups, as determined by the dashed horizontal line, and illustrates how the problem (communications blow-up) in FIG. 2 may be addressed.

Figure 4:
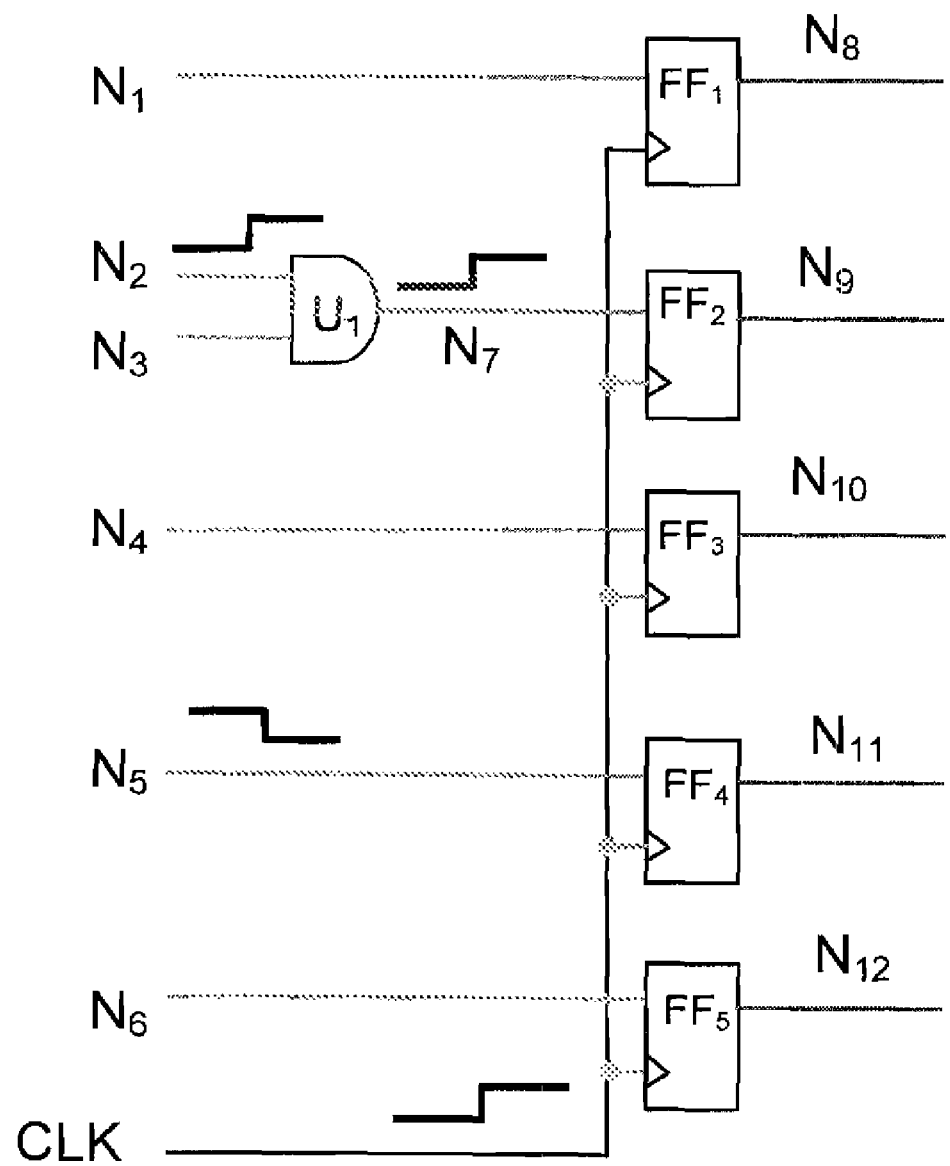

FIG. 4 is an illustration of "Fence." The ETFF's (edge-triggered flip-flops) serve as a barrier or "fence"; events originating in a given subset are blocked at this point and cannot propagate into other subsets until an active clock edge occurs. In the drawing, an event occurs on wire N2, and another event occurs on wire N5. At some later time, depending on the internal delay of gate U1, the event on wire N2 appears at wire N7. Despite the fact that the events reach ETFFs FF2 and FF4 and different times, the events on N5 and N7 are blocked at the ETFFs and cannot continue to propagate forward until an active clock edge (rising edge in FIG. 4) appears on the CLK input. When the active clock edge appears, events at the ETFF inputs are allowed to migrate to the outputs of those ETFF's. At the same time, for those ETFFs that are identified as primary outputs of the subset, the signal values not only propagate to the outputs, but those signal values are also simultaneously transmitted to the inputs of the other subsets by means of a high speed network.

Figure 5:
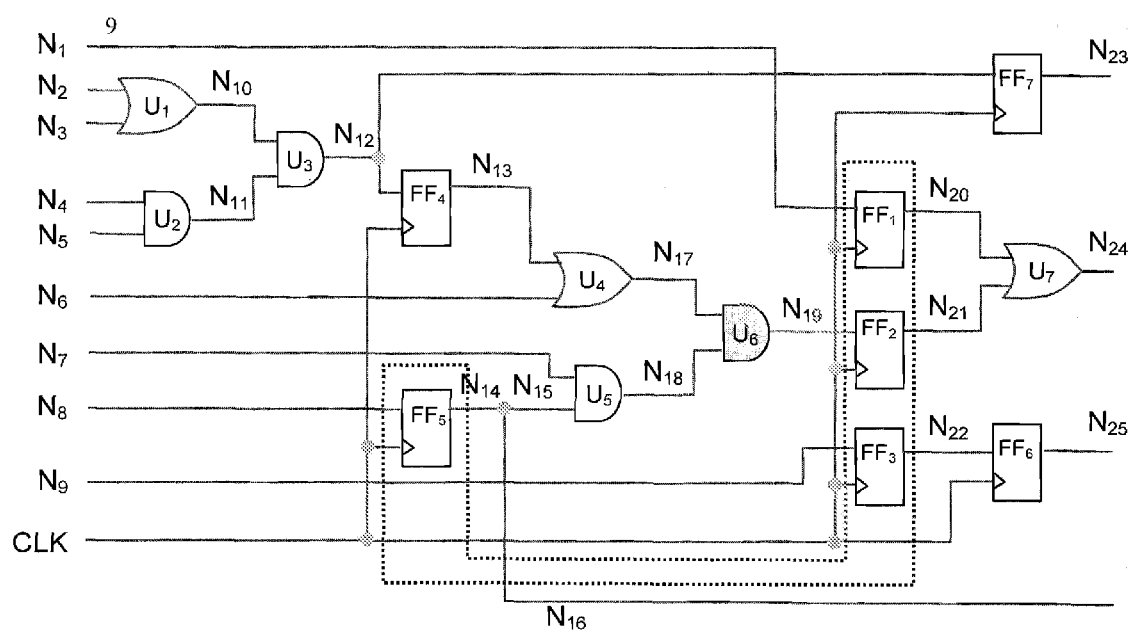

FIG. 5 is an illustration of "Backtrace." From each group of ETFFs (edge-triggered flip-flops), the Partitioner proceeds back from the inputs of these ETFFs towards the primary inputs of the circuit. In the course of backtracing, the algorithm gathers up all of the logic contained in a cone and includes that logic in a separate subset. The collection of these subsets form a partition. In the FIG. 5, assume that the backtrace starts with the group {FF1, FF2, FF3, FF4, FF5}, outlined in a box. A backtrace is performed individually on each of the ETFFs in G1. The logic elements identified while backtracing from each of the ETFFs in this group are merged to form the final cone of logic, i.e., the subset.

Figure 6:
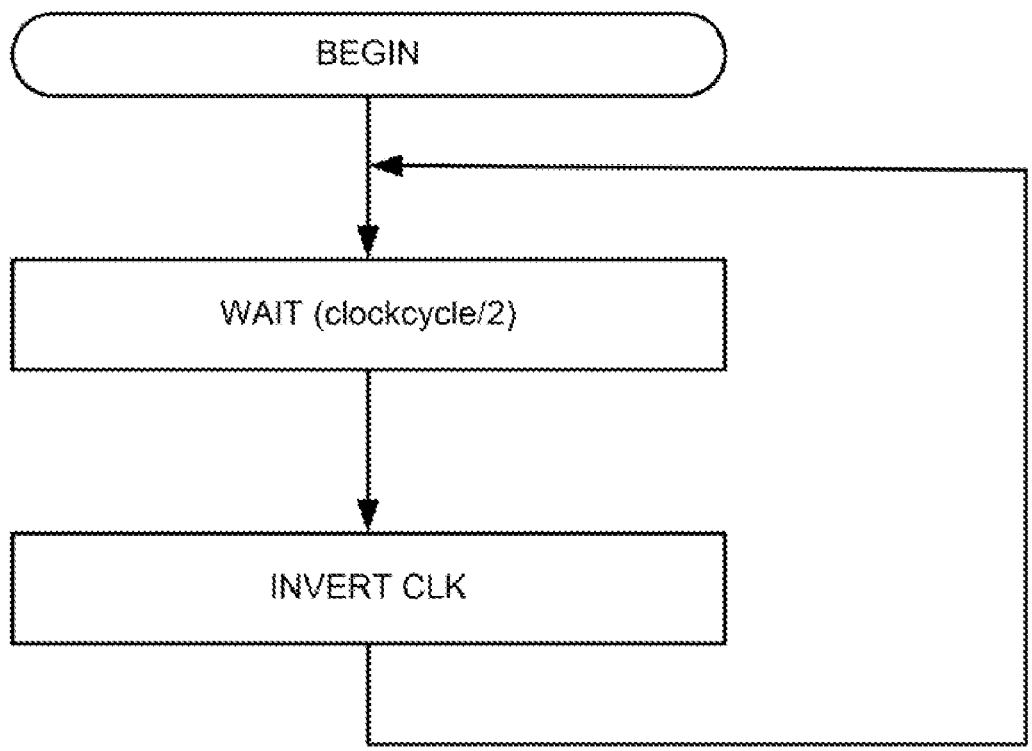

FIG. 6 is an illustration of clock generation and reset signal. The ETFFs (edge-triggered flip-flops) illustrated in FIG. 5 are all driven directly by a clock signal labeled CLK. Generation of a clock signal in the Verilog HDL is illustrated by the code in FIG. 6.

FIG. 7 is an illustration of a Partition of Subsets. On active clock boundaries, logic events are exchanged between the subsets. Four subsets, labeled S1, S2, S3 and S4, communicate over a network. These results are broadcast to the other subsets by means of the software interface (S/W I/F). Each subset monitors this network and extracts the signal values that it needs to apply to its primary input pins. Once it has all the values that it needs, it can proceed with simulating the next clock period. From this drawing it can be seen that the network connects the subsets for communication purposes, while at the same time isolating the subsets from one another so that each subset can be under control of a separate CPU, operating system, and simulator.

Figure 8:
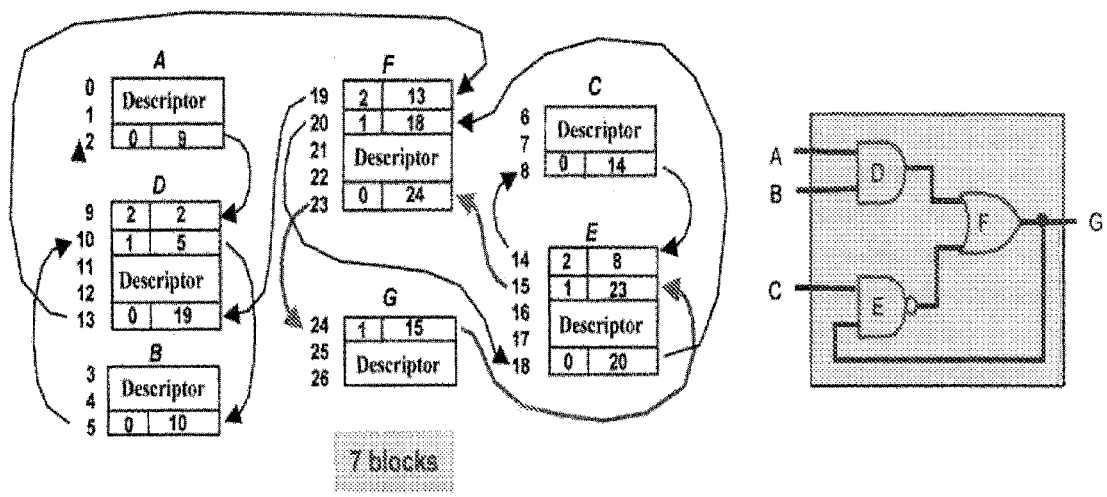

FIG. 8 is an illustration of Data Structure for the Simulation Model. A data structure is implemented by means of a descriptor block for each logic element (standard cell or gate) in the design to be partitioned and simulated. Each logic element including its timing information is stored in a separate cell. This process captures the primary inputs, primary outputs, and connectivity information for each element (cell or gate) of the input design. The data structure represents the input circuit design as a simulation model in computer memory.

Figure 9:
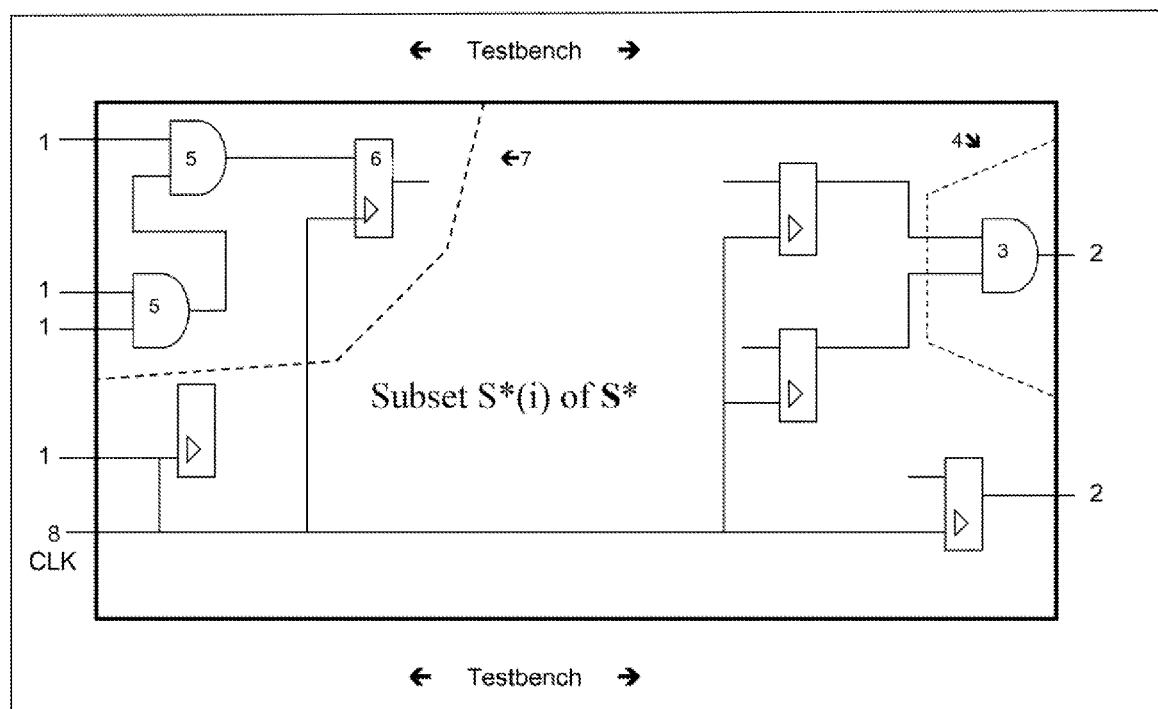

FIG. 9 is an illustration of Peripheral Logic of S(i) and the Testbench. The Figure illustrates input peripheral logic and output peripheral logic, and their relation to the testbench.

DETAILED DESCRIPTION

In this document, the terms "input circuit design," "circuit design," "circuit," and "design" as used herein mean an electronic design that is intended to be fabricated as an integrated circuit (IC) device, an ASIC (Application Specific Integrated Circuit) device, or an SOC (system on chip), any subsection thereof, and any electronic system created by combining such circuit elements and devices. Such a circuit design may be entirely synchronous, or it may also contain asynchronous logic and embedded analog blocks. "Computer," "CPU," "compute node," "and "machine" are used synonymously.

Other and further definitions and clarifications of definitions may be found throughout this document.

Reference will now be made in detail to several embodiments of the invention that are illustrated in the accompanying drawings. Same reference numerals are used in the drawings and the description to refer to the same apparatus elements and method steps. The drawings are in simplified form, not to scale, and omit apparatus elements and method steps that can be added to the described systems and methods, while including certain optional elements and steps.

A person skilled in the pertinent art should have familiarity with EDA tools and procedures, e.g., netlist readers, flatteners, hardware description languages and their programming language interfaces (e.g., Verilog, VHDL), simulation and simulators, backtracing and cones of logic. Such person skilled in the art should also have familiarity with computer programming practices and techniques, e.g., data structures, linked lists, communicating between networked computers.

Because present day digital electronic circuits contain so many functions, often implemented by a million or more logic gates on a single integrated circuit (IC), they are usually represented hierarchically. This allows functions to be represented individually on diagrams, thus making it easier to see the individual functions and their relationship to each other. Such a configuration is depicted schematically in FIG. 1. The drawing shows four levels. The top-most level, level 1, shows a printed circuit board (PCB) which is expanded in level 2 to show several ICs that are mounted on the PCB, and interconnected by metal runs embedded in the PCB. Level 3 shows the next level of refinement, an expansion of a single IC into a number of functions or macro cells. Then, at Level 4 a function can be expressed as a collection of logic gates or as a sequence of lines of code, written in an HDL such as Verilog or VHDL. This illustration may be expanded to several more layers of detail, making it clear that a decomposition of large electronic designs and systems is essential to an understanding of their operation.

This hierarchical view has motivated many partitioning schemes, as noted above. For an operation such as logic synthesis—where the goal is to place operations close to other operations that either drive them or are driven by them in order to minimize the amount of metal runs needed to connect the functions, this view is effective. However, for simulation, this "vertical" view may thwart attempts to reduce the amount of CPU time required to complete a simulation. This is illustrated in FIG. 2. In this circuit, there are two outputs, C0 and C1. There is a dashed vertical line running through the circuit. It would seem natural to partition the circuit into two subsets as indicated by the dashed line. However, on closer inspection, it can be seen that the wire labeled N10 drives two wire segments labeled N11 and N12. The wire N11 is contained in the upper subset, while N12 is in the lower subset. As a result, every time there is a logic event on wire N10, that event has to be transmitted to the lower subset. In FIG. 2 that would not seem to be significant, but on large digital circuits, it is not inconceivable that many thousands of events have to be shared between the subsets of the partition at every tick of the clock, causing performance degradation by communications "blow up."

FIG. 3 illustrates the approach to partitioning the circuit exploited by selected embodiments of the current invention. The dashed line is horizontal, and partitions the circuit "horizontally," as suggested by FIG. 1. The backtracing proceeds from a collection of edge-triggered flip-flops (ETFF), and proceeds back from the inputs of these ETFFs towards the primary inputs of the circuit (moving downwards in FIG. 3). In the course of backtracing, the algorithm gathers up all of the logic contained in a cone and includes that logic in the partition. The cone may include other ETFFs and the logic that drives the Data inputs of those ETFFs. Furthermore, the ETFFs need not all be at the same horizontal level, enabling each subset to be simulated on different types of simulators running on different types of computers, under the control of different operating systems.

In accordance with the method shown in FIG. 3, events do not have to be communicated between subsets at every tick of the circuit clock. The ETFFs thus serve as a barrier or "fence": events cannot escape from a subset, into other subsets, until an active clock edge occurs (see FIG. 4). Only then events at the ETFFs are permitted to migrate to the outputs of the ETFFs and propagate forward into other subsets. This "fence" and the method of its creation and exploitation are used in selected embodiments of the invention.

FIG. 5 illustrates the general operation of the Partitioner. A group of ETFFs is selected, based on criteria defined later, as a subset. In FIG. 5, for purposes of discussion, we assume that the backtrace starts with the group S1={FF1, FF2, FF3, FF4, FF5}. This group is shown in FIG. 5 surrounded by a dotted line, illustrating the "fence" concept shown in FIG. 4. A backtrace is performed individually on each of the ETFFs in S1. The logic elements identified while backtracing from each of the ETFFs in this group are merged to form the cone of logic derived from S1, denoted S*(1).

Referring to FIG. 5, we arbitrarily choose to begin with the ETFF labeled FF1. As will be seen, any of the five ETFFs could have been processed first. The data input of FF1 is connected to wire N1, which may be driven by a primary input of the circuit being partitioned, or it may be driven by the output of an ETFF contained in another subset. In either event, having gone back as far towards the inputs as it can go, the backtrace from FF1 stops at that point. The Partitioner then chooses an ETFF that has not yet been backtraced. The choice is arbitrary, so, for the sake of discussion, we assume the Partitioner chooses to perform its next backtrace from FF2.

The backtrace from FF2 first encounters the AND gate labeled U6. The Partitioner marks it for inclusion in the cone of logic. The backtrace continues working back by examining the elements that drive the inputs to U6. The drivers are an OR gate labeled U4, and an AND gate labeled U5. These are also marked for inclusion in the cone of logic that define this subset. In the next step, the Partitioner examines the inputs of U4. Wire N13 is driven by FF4, which is an ETFF. Additionally, FF4 is included in the set G1. Because FF4 is contained in G1, the wire N13 is included in the subcircuit as an internal net and the backtrace stops here. Wire N6 is a treated as a primary input to this subset.

The AND gate U5 is processed similarly. Wire N7 is treated as a primary input to this subset, and FF5 is an ETFF which is contained in set G1. Note that if FF4 or FF5 had not been contained in G1, then the wire driven by that ETFF would be treated as a primary input. This can be seen by the relationship between FF3 and FF6. FF6 is not contained in the subset defined by the set G1, so the wire N22 is an output of the subset defined by G1, and at the same time it serves as an input to the subset defined by the set Gi in which FF6 is contained.

Eventually, the Partitioner backtraces from ETFFs F4 and F5. When the Partitioner selects FF4, the wire N13 has already been included in the subset, now FF4 is included in the subset. The Partitioner resumes the backtrace from the Data inputs of FF4. From this discussion, it can be seen that the logic gates U1, U2 and U3 will be included in the cone of logic for this subset. The backtrace from FF5 is simpler because it only includes the wire N8, which is treated as an input to the circuit.

A number of observations concerning FIG. 5 may be made, as follows:

i) The backtrace could have proceeded by selecting ETFFs in any order. The cone of logic, or subset, would be identical to the subset created by processing the ETFFs in the order FF1, FF2, FF3, FF4, and FF5. This follows from the fact that all of the backtracing is performed first, logic elements and ETFFs are marked for inclusion in the subset, then the ETFFs are examined to determine which ETFFs serve as primary outputs and which ETFFs are strictly internal to the subset.

ii) When determining which ETFFs serve as primary outputs, the Partitioner observes that FF4 only drives the OR gate U4, so FF4 is completely in the interior of the subset. On the other hand, FF5 drives US, but it also drives wire N16, which in turn drives logic in some other subset, hence FF5 must be treated as a primary output of the subset. It bears repeating that the inputs labeled N1 through N9 may be primary inputs to the integrated circuit being partitioned, or they may be driven by ETFFs contained in some other subset, or some of N1 through N9 may be primary inputs and others may be driven by ETFFs in one or more other subsets, i.e., by any combination of them.

iii) FF6 and FF7 are not contained in the logic cone defined by the set G1. FF3 is a primary output of the subset defined by G1, and FF6 is a primary input of subset Gi, for some i. It can be seen from FIG. 5 how the output of one subset drives an input of another subset. When the Partitioner creates the netlists for the subsets, the Partitioner identifies wire N22 as a primary output of one subset and it identifies wire N22 as a primary input to the other subset.

iv) The subcircuit defined by logic gates U1, U2, and U3 appears in two or more subsets. Any logic that appears in two or more subsets is redundant logic. That logic must appear in each of the subsets in which the Partitioner encounters it during backtracing. Sometimes it is possible to minimize this redundancy by including additional ETFFs in a group selected for backtrace. For example, FF7 could be merged into G1. Then, the subcircuit U1, U2, U3 might only occur in one subset. One of the goals or functions of the Partitioner is to reduce to a minimum the amount of logic that appears in two or more subsets. One way to accomplish this is by having the user identify common structures to the Partitioner. For example, the Partitioner may be told (programmed) to keep all the ETFFs in an output register driven by an ALU in one subset, rather than allow the ETFFs to be distributed into two or more groups.

v) In the example of FIG. 5, the Partitioner began with the group G1. The Partitioner determined that F4 was internal to the subset. Hence, the fence for this subset is the set F1, F2, F3 and F5. They are illustrated by the broken line.

vi) The inputs N1 through N9 are driven by the output ETFFs of other subsets or are generated by the testbench.

vii) Although FIG. 5 shows logic gates, there is nothing to preclude the backtrace from including RTL code. In Verilog, the equivalent of an ETFF is the expression "always @(posedge CLK)" or "always @(negedge CLK)". The backtrace encounters RTL constructs which, during synthesis, cause logic elements to be substituted for the RTL construct. For example, the backtrace may encounter an "if . . . else" expression, such as "a=(b) ? c:d;", which means that the wire or reg called "a" receives the value of "c" if "b" is true, and it receives the value of "d" if "b" is false. The key point here is that, conceptually, a backtrace through logic gates has a counterpart in RTL code, and it is understood that this algorithm applies equally to gate level circuit descriptions and RTL level circuit descriptions. Further extensions to transistor elements, such as CMOS or NMOS, and behavioral code, are also claimed for Partitioner.

viii) It is common for logic designers using a standard HDL, such as Verilog or VHDL, to create test benches in the Verilog or VHDL language. The Partitioner includes this test bench, which is used to generate stimuli to be applied to the circuit, into a subset. Combinational logic on the periphery on the circuit being partitioned is included in this subset, together with the testbench. For example, in FIG. 5, the gate U7 and the wires N20, N21 and N24 are selected by having the Partitioner backtrace from the primary output N24 of the circuit. All of the combinational logic that the Partitioner encounters when backtracing from N24 is gathered up and merged with the testbench subset. The Partitioner backtraces from all the primary output pins of the circuit, gathers up the combinational logic that drives the primary outputs, and merges this logic into the subset that contains the testbench.

The ETFFs (edge-triggered flip flops) illustrated in FIG. 5 are all driven directly by a clock signal labeled CLK. Generation of a clock signal in the Verilog HDL is illustrated by the following code:

```
'define clockcycle 100
initial
forever begin
   #('clockcycle/2)
   CLK=~CLK;
end
```

First, a "define" compiler directive appears. it equates the value 100 with the name clockcycle. Then an "initial" block appears. The initial command tells the Verilog simulator to perform the commonds demarcated by "begin . . . end". In this case, the signal CLK is set to the logic value 0. Then the RESET signal is set to zero. That is followed by an assignment of 0 to a signal called READY. Next, a "forever" command occurs, it is also demarcated by "begin . . . end". The two lines of code instruct the CLK signal to change to its complementary value every 50 time units ('clockcycle/2), and this is to occur forever, which in practice means until the completion of simulation.

There is another block of logic that starts with the command "always". It is followed by another "begin . . . end" pair. They demarcate two lines of code that define a duration of time, after which the RESET signal is set to logic 1. The duration of time is indicated by the sharp (#) symbol, followed by a period of time. In this example the period of time is the expression in parentheses, i.e., the value of clockcycle multiplied by 2.5. Since 'clockcycle was previously defined to be 100 units, the expression evaluates to 250 units of time, relative to the start of transmission. In other words, the RESET is initially set to 0, and after 250 time units it is set to its inactive state, the value logic 1. Another time value occurs, as indicated by the expression #('clockcycle), this duration is 100 time units. Then, after 100 time units has elapsed, the signal READY is set to the logic value 1. Assignment of logic values to the signal READY is material to this discussion for the purpose of illustrating how signals values are generated by means of the Verilog HDL, and also to illustrate that the logic designer may generate logic events at any desired time, quite easily, by means of the language constructs illustrated here.

As just illustrated, many signals, in addition to the RESET, may be generated in the testbench. These logic events may be periodic, or they may occur randomly with respect to the clock signal(s). As a result, when simulating a partition, these signals may require many additional broadcasts of signal values at simulation times independent of the clock edges that normally control behavior of the design. If there are a great number of these random logic events occurring throughout the simulation, then simulation performance will be adversely impacted. To minimize the impact of these events, it is possible to move parts of the testbench into different subsets. For example, if a particular signal changes randomly, and only affects the inputs to one subset during simulation, it could be moved to the affected subset. In effect, the testbench is distributed among the subsets in a manner analogous to the logic. This could be manually implemented, by inspection of the testbench. Other options for dealing with test stimuli include storing test stimuli in a memory or register set that are controlled by the clock. Then, those stimuli are disseminated to other subsets in the same manner as the logic events that are generated within the subsets.

It is possible that the clock signal controlling the ETFFs is generated by a logic subcircuit composed of logic gates and ETFFs. In order to determine this, the Partitioner must backtrace from the ETFF clock inputs and gather up any logic that is contained in the cone of logic driving the clock input of the ETFFs. The same rules that apply to the cones of logic that drive the Data inputs to the ETFFs applies to the cones of logic that drive the clock inputs to the ETFFs.

The subsets created by the Partitioner operate in isolation during a clock period. However, on active clock boundaries, logic events must be exchanged between the subsets. This is illustrated in FIG. 7 where four subsets, labeled S1, S2, S3 and S4 communicate over a network. At the end of a simulation period, the PLI (programming language interface; see, for example, IEEE Std 1364-2001) accesses the internal data structures of the simulator and retrieves simulation results appearing on the output pins of the subset. These results are broadcast to the other subsets by means of the software interface (S/W I/F). Each subset monitors this network and extracts the signal values that it needs to apply to its primary input pins. Once it has all the values that it needs, it can proceed with simulating the next clock period. From this drawing it can be seen that the network connects the subsets for communication purposes, while at the same time isolating the subsets from one another so that each subset can be under control of a separate CPU, operating system, and simulator. The one point of commonality is the need for each simulator to be able to extract logic values from its data structures by way of the PLI or some similar such mechanism.

Partitioning Algorithm

First Embodiment (Single Clock; All Digital)

The first embodiment describes how to partition at the cell level an integrated circuit design having a single clock, and no asynchronous logic or analog blocks. The input circuit design may consist of any number of digital circuit elements, e.g. AND gates, NAND gates, OR gates, delay flip flops, and other more complex digital circuit functions such as are specified in standard cell libraries from commercial integrated circuit foundries, may contain mixed levels of design hierarchy, and exists on a computer readable medium.

The input circuit design is to be partitioned into n subsets (n any integer$\geq 2$) to be simulated on n networked computers. The user's choice of n may be constrained by the user's resources: the number of computers available, how much dynamic memory each computer has, and how many simulator licenses are available. An optimal choice of n is determined by the size of the circuit: the subsets should simulate within the dynamic memory of the computer they are running on, i.e., without "disk swapping." Choosing an n that is too large relative to the input design's size can create subsets that are non-optimally small, leading to performance degradation through excessive communications.

1. Read in Design and Flatten to Cell Level

Read in the netlist and timing data for the circuit design and flatten the circuit design to the cell level (defined by the cell library for the target fabrication process) to remove the levels of design hierarchy. Let s=the number of distinct circuit elements in the design. The named variables and sets are as follows:

s=the integral number of distinct circuit elements in the design, where the blocks of asynchronous logic and the blocks of analog circuitry are counted as single circuit elements and treated as "black boxes".

N$\geq$the number of ETFF's with control bit N1 ON=the number of ETFF's reachable from primary inputs (test bench N'=user-adjusted value of N (Step 3c)

n=the desired number of subsets in the final partition

S=the master list of all ETFF's in the circuit design

M=|S|=the number of distinct elements in S k=the number of ETFF's in S having N1 OFF=M−N'.

S={F1, F2, . . . , Fk, P1, P2, . . . , PN} with M=k+N=the number of unique elements in S, and N selected as in step 3c, is a list of all the ETFF's with those reachable from primary inputs placed at the end.

u=the closest integer to the quotient of k and (n−2); r=remainder: k/(n−2)=u+r/(n−2) or k=u(n−2)+r.

S(i)=disjoint subsets of S (i=1, . . . , n−1) whose union equals S. (Step 4b)

S={S(1), S(2), . . . , S(n−1)}

"association" subsets are formed from S(i) by including the logic cones generated during backtracing (step 5a).

S*(i)=association subset created from S(i) by including its logic cones. (steps 5a and 5b)

S*={S*(1), . . . , S*(n−1)}=master association set. S* is electrically equivalent to the original circuit. (step 5d)

T*(i)=testbench association subset for S*(i)=all ETFFs in S*(i) with N1 ON and their associated logic cones. (step 5d)

T*=master testbench association set=all ETFFs with N1 ON and their associated logic cones=input periphery.

X(i)=fence subset={D(i,1), D(i,2), . . . , D(i,$\lambda$)} where each D(i,j) is an exterior ETFF in X(i)$\subseteq$R(i)$\subseteq$S(i)$\subset$S (i=1, . . . , n−1), and $\lambda$ is an integer less than the number of elements in S(i).

X*(i)=association set of X(i)={all D(i,j) in X(i) and their associated logic cones}

T*=testbench association set=all elements of T' and their associated logic cones (merged with the testbench).

Q*(i)={"output periphery" logic elements of X*(i)} which are merged with the testbench.

Y(i)=S*(i)UQ*(i)=completion set formed from S*(i) and its output periphery

P(i)=the netlist module formed from X(i)

P={P(1), P(2), . . . , P(n)} is the desired partition

2. Create Data Structure, Control Bits

2a. Implement a data structure in a computer readable medium with s cells (one cell for each circuit element), and store each circuit element in the flattened input design, including its timing and connectivity information, one element in each of the s cells. This data structure represents the circuit as a simulation model in computer memory. This process captures the primary inputs, primary outputs, and connectivity information, as identified and illustrated in FIG. 8 ("Data Structure for Simulation Model"). The data structures that describe the circuit elements contain both forward and backward links, e.g., the output of one element contains a link to the input of each element that it drives. In FIG. 8, there is a descriptor block for each gate (D, E, F), each primary input (A, B, C), and for each primary output (G), totaling 7 blocks for the logic circuit shown. (NB: The inputs to F are not primary inputs; the outputs from D and E are not primary outputs.) By tracing paths it is possible to find all signals driving a gate, and all gates driven by a signal. Example: F (line 23) drives G (line 24) and E (line 15). A data structure is implemented by means of a descriptor block for each logic element (standard cell or gate) in the design to be partitioned and simulated. Each logic element including its timing information is stored in a separate cell. This process captures the primary inputs, primary outputs, and connectivity information for each element (cell or gate) of the input design. The data structure represents the input circuit design as a simulation model in computer memory. (Cf Digital Logic and Testing by Dr. Alexander Miczo.)

2b. In each cell of the data structure create four control bits: N1 (input periphery), N2 (backtrace), N3 (exterior ETFF's) and N4 (output periphery), each initially being (set to) OFF. These control bits are used to track various pre-processing steps performed on the input design.

3. Input Periphery Pre-processing and Forward Trace

3a. Identify the primary inputs of the circuit that have interactions with the test bench ("relevant primary inputs"), and create a linked list of the relevant primary inputs. See FIG. 9. The information to determine these was stored in the data structure in step 2a. (In FIG. 9, the set S* is created as described in Step 5, and is subdivided into a pre-determined number of subsets, all nearly the same size, while S*(i) represents one of these subsets; the legend is as follows: 1—Input ports of S*(i), 2—Output ports of S*(i), 3—Logic element on output periphery, 4—Dashed line encloses set T*(i), 5—Logic elements on input periphery, 6—ETFF on input periphery, 7—Dashed line shows what is merged with the testbench, 8—CLK or clock input.)

3b. Using the forward links in the data structures created in step 2a (FIG. 8), forward trace (the same as a backtrace, except proceeding "forwards" towards the outputs) from each relevant primary input until an ETFF is encountered, then stop forward tracing, turn that ETFF's control bit N1 ON, and add it to a linked list of ETFF's that will be placed in a single subset of the partition. Let N=the number of ETFF's with control bit N1 ON=the number of ETFF's reachable from primary inputs.

3c. N as defined in step 3b is the minimum value of N, and is the default value. Depending on n=the desired number of subsets in the final partition and on the total number of ETFF's in the circuit design, the user's optional choice of a larger value of N may result in more evenly-sized subsets. Let N'=the adjusted value of N. N'≧N.

Steps 3a and 3b identify the "input periphery" of the circuit—those elements that will interact with the testbench. Step 3c allows for user interventions, e.g., for load balancing.

4. Create and Subdivide the Master List S of ETFFs

4a. Identify all edge-triggered flip flops (ETFFs) in the data structure. ETFFs include delay flip flops (DFFs), JK flip flops (JKFFs), and toggle flip flops (TFFs). Create a linked list of all ETFF's having control bit N1 OFF. To the end of this linked list, add the linked list of all ETFF's having control bit N1 ON (input periphery). This creates the master list S, containing M ETFF's separated into two groups, with an ordering (first group, second group) of the two groups. Any ordering within the two groups may be allowed in embodiments. Letting k=the number of ETFFs having N1 OFF, and N' as determined in step 3c, S={F1, F2, ..., Fk, P1, P2, ..., PN'} explicitly lists the ETFFs belonging to S; k=M−N'.

4b. Divide list S into a total of (n−1) subsets: S={S(1), S(2), ..., S(n−1)}. S(n−1) is created from the elements P1, P2, ..., PN' (the input periphery ETFFs). The other S(i) (i=1, ..., n−2) are created by are dividing by the first part of the list S−F1, ..., Fk−into (n−2) nearly equal subsets.

One way (among several) to do this is this: starting at the beginning of the master list S, subdivide the first k=M−N' elements into (n−2) disjoint subsets. Here, k and (n−2) are integers; dividing k by (n−2) yields an integer quotient q and an integer remainder r, i.e., k/(n−2)=q+r/(n−2). Let u=the closest integer to the quotient q, i.e., if r≠0, round q up or down to the nearest integer, depending on the value of r. Create S(1) from the first u elements of S, S(2) from the next u elements, continuing until (n−3) equal-sized subsets have been created. The subset S(n−2) contains the remaining k−u(n−3) elements of {F1, ..., Fk}. The subset S(n−1) is created from the remaining elements P1, P2, ..., PN (which includes all ETFF's with control bit N1 ON).

Thus S is expressed as S={S(1), S(2), ..., S(n−1)}. The first (n−3) subsets have exactly u elements in each. The penultimate subset S(n−2) has exactly k−u(n−3)=u+r=M−N'−k elements. The final subset S(n−1) has exactly N' elements.

The subsets S(i) of S may be written explicitly as follows:

$$S(1) = \{F(1), F(2)..., F(u)\}$$

$$|S(1)| = u = \text{number of } ETFFs \text{ in } S(1)$$

$$S(2) = \{F(u+1), F(u+2), ..., F(2u)\} \quad |S(2)| = u$$

$$S(3) = \{F(2u+1), F(2u+2), ..., F(3u)\} \quad |S(3)| = u$$

$$\vdots \quad \vdots \quad \vdots$$

$$S(n-3) = \{F[(n-1)u+1], ..., F[(n-2)u]\} \quad |S(n-3)| = u$$

$$S(n-2) =$$

$$\{F[(nu+1)], F[(nu+2)], ..., F(k-1), F(k)\} \quad |S(n-2)| = k - u(n-3)$$

$$S(n-1) = \{P(1), P(2), ..., P(N')\} = \{F(k+1), F(k+2), ..., F(M)\}$$

$$|S(n-1)| = N'$$

The result is: $S = \{S(1), S(2), ..., S(n-1)\}$, with $S(n-1)$ containing all the $ETFF$'s having $N1$ ON, and $|S| = |S(1)| + |S(2)| + ... + |S(n-1)| =$ $M$ (proof: $M = u(n-3) + k - u(n-3) + N' = k + N'$).

The above procedure exhausts all the elements of the master list S, produces (n−1) disjoint subsets that subdivide S, and captures all ETFF's reachable from primary inputs (N1 ON) in a single subset.

One aspect of the invention is that, for most of the subsets that it creates, the subset's primary outputs are driven strictly by ETFFs. Furthermore, most, or possibly all, of a subset's primary inputs are driven by primary outputs emanating from other subsets. The exception, explained later, stems from the possible need to handle the testbench differently from other subsets.

4c. There may be (optional) user interventions at this step to optimize placements of ETFFs in particular subsets to achieve load balancing, grouping by attributes, or other goals.

5. Create Association Subsets S*(i) and Testbench Subsets T*(i); First Backtrace 5a. Take S(1) from Step 4b. Select any ETFF F(j) in S(1). Backtrace (see FIG. 5) from the input of F(j) creating a logic cone from F(j), stopping when an ETFF is encountered. Turn control bit N2 ON when a circuit element is encountered during the backtrace, including the beginning and terminating ETFFs. All circuit elements encountered during a backtrace are assigned to S(1) such that no circuit element is ever divided between subsets. Repeat for every ETFF in S(1).

5b. Create the association set S*(1)={S(1) with its logic cones included}. S(1)⊂S*(1).

5c. Create the testbench subset T*(1) by identifying all ETFF's in S*(1) with control bit N1 ON and their associated logic cones. Form a new set T*(1) from these elements, without deleting them from S*(1), i.e., T T*(1)⊂s*(1).

5d. Iterate Steps 5a to 5c for each subset S(i), resulting in the association sets S*(1), S*(2), ..., S*(n−1), and their associated testbench sets T*(1), T*(2), ..., T*(n−1); with each T*(i)⊂S*(i).

Let S*={S*(1), ..., S*(n−1)}=master association set.

5e. Merge the sets T*(1), ..., T*(n−1) into a single set T*, the testbench association set. T*⊂S*.

5f. The n association subsets S*(1), S*(2), ..., S*(n−1), T* form the basis for the partition (but does not yet include all input circuit elements).

"Association" subsets S*(i) and T*(i) are created from the subsets S(i) of step 4 by including their associated logic cones. The testbench association set T* isolates the ETFFs (and their associated logic cones) that will communicate with the testbench. This "input periphery extraction" insures that all circuit elements connecting to primary inputs are captured.

6. Create Fence Subsets X(i) and Output Periphery, Second Backtrace

6a. In S*(1), sort the ETFF's into interior and exterior ETFF's. Interior ETFFs do not connect to any logic element outside of S*(1); exterior ETFFs communicate with logic outside of S*(1). The information to make this distinction was stored in the data structure in step 2. When an exterior ETFF is detected, turn its control bit N3 ON.

Form the fence subset X(1)={all exterior ETFF's in S*(1)}={all ETFF's in S*(1) having N3 ON}.

The previous steps were "pre-processing" for this step. The fence allows the communications between S*(1) and any other subset to be clocked or otherwise controlled. See the FIGURES.

6b. Identify all circuit elements, primary inputs and primary outputs of the association subset S*(1).

6c. Backtrace from the primary outputs of S*(1), turning control bits N2 and N4 ON each time a circuit element is encountered, and terminating when an ETFF is first encountered.

This step identifies the output periphery elements of S*(1) that were missed in the first backtrace (step 5a).

6d. Create a new set Q*(1) containing the elements of S*(1) having N4 ON, and include the ETFF that terminated the backtrace.

Q*(1)={output periphery elements of S*(1)}={all exterior ETFF's in S*(1) having control bit N4 OFF}.

6e. Form the completion set Y(1)=S*(1) U Q*(1).

This "ouput periphery extraction" ensures that all circuit elements connecting to primary outputs are captured.

6f. Iterate (n−1) times from Step 6a to Step 6e, for each subset S(i) (i=2, 3, ..., n−1) and T*, forming progressively: the fence subsets X(2), X(3), ..., X(n−1); then the sets Q*(2), Q*(3), ..., Q*(n−1), Q*(n) where Q*(n) contains the elements of T* having N4 ON; then finally the completion sets Y(2), Y(3), ..., Y(n).

The n sets Y(1), Y(2), Y(3), ..., Y(n) electrically equivalent to the input design, and form the basis for the final partition.

6g. Check control bit states. The numbers of ON states should be:

N1=N (step 3b)
N2=s (step 6f)
N3=design-dependent variable
N4=design-dependent variable 6h. Reset all control bits N1, N2, N3 and N4 to the OFF state.

7. Create Partition Modules; Post-processing

7a. From the subset Y(1) in Step 6e, and the information in the data structure, form a module and write the result to an output file, creating the netlist for Y(1). This yields the netlist module P1.

7b. Iterate Step 7a n times, once for each subset Y(i). Completion of this step yields n separate netlist files (modules). P(n) derives from T*, and is merged with the testbench. P={P(1), P(2), ..., P(n)} is the desired partition.

7c. Implement clock (CLK) inputs. The CLK inputs drive the fences X(i), isolating each subset of P. When all the simulators have finished their simulation cycle, an active CLK edge is generated in order to initiate the next transfer of logic values between subsets.

8. Simulation

8a. Load each partition subset P(1), P(2), ..., P(n) onto n networked computers, one subset per computer, with each computer having access to its own simulator and sufficient memory compared to the size of the P(i).

8b. Collect and merge the results from the individual simulations, and present them as if the whole process had occurred on a single event-driven simulator running on a single CPU. The collection and merging of results may be performed in the testbench.

The steps above transform the original design, through several stages, into a new electrically equivalent representation (the Partition). A method is shown whereby subsets are formed, their input and output peripheries are identified and merged with the testbench, and the fence subsets are created which allow control of communications between subsets. The method of construction of the fence ensures that the communications between the subsets are minimized and synchronized.

Second Embodiment (Multiple Clocks; All Digital)

The second embodiment of the invention describes the case of the input design having multiple clocks, and incorporates the use of the first embodiment. The input circuit design is a digital electronic circuit (netlist and timing data) having multiple clocks. The design may be of any size, and may contain mixed levels of design hierarchy.

As in the first embodiment, it is desired to create an electrically equivalent partition P={P1, P2, ..., Pn} of the circuit design consisting of n subsets, and simulate the subsets simultaneously on n separate CPU's on a network (one partition subset per CPU), each CPU with its own simulator license.

Step 1'. The design is divided into individual clock domains, i.e., all the circuit elements controlled by each clock are grouped together. Methods of accomplishing this are well-known among those skilled in the art. Determine the number of circuit elements in each clock domain and represent the input design as $\{, \Sigma 1, \Sigma 2, \ldots \Sigma \mu\}$ where each $\Sigma i$ is a clock domain, $\mu$ is the number of clocks in the input design, and the $\Sigma i$ are arranged in order from the smallest to the largest (by number of circuit elements).

Step 2'. Determine how the partition is to be distributed over $\{\Sigma 1, \Sigma 2, \ldots, \Sigma \mu\}$. Assume n is the number of compute nodes available on the user's network, as well as being the desired number of subsets in the partition, and assume $\mu \leq n$ (i.e., the number of clock domains is less than or equal to the number of computers available). Depending on the relative sizes of the $\Sigma i$, the user may decide which need to be further partitioned.

Step 3'. Perform Steps 1a through 7b described in the first embodiment for each clock domain $\Sigma i$ that was determined in the preceding step to need further partitioning. The collection of these n subsets comprise the desired partition P'.

Step 4'. Perform Steps 8a through 9b as outlined in the first embodiment for each subset in P'.

Third Embodiment (Single Clock; including Asynchronous and Analog Blocks)

The third embodiment of the invention describes the case of the input design including asynchronous logic or analog blocks, and having a single system clock. The third embodiment incorporates the use of the first embodiment.

1. Read in Design and Flatten to Cell Level

Read in the netlist and timing data for the circuit design and flatten the cell. Let s=the number of distinct circuit elements in the design, where blocks of asynchronous logic and blocks of analog circuitry are counted as single circuit elements. See FIG. 10. The Named Variables and Sets are as follows:

s=the integral number of distinct circuit elements in the design, where the blocks of asynchronous logic and the blocks of analog circuitry are counted as single circuit elements and treated as "black boxes";

N≧the number of ETFF's with control bit N1 ON=the number of ETFF's reachable from primary inputs (test bench);

N'=user-adjusted value of N (Step 3c);

n=the desired number of subsets in the final partition;

S=the master list of all ETFF's in the circuit design;

M=|S|=the number of distinct elements in S;

k=the number of ETFF's in S having N1 OFF=M−N';

S={F1, F2, ... Fk, P1, P2, ... PN} with M=k+N=the number of unique elements in S, and N selected as in step 3c, is a list of all the ETFF's with those reachable from primary inputs placed at the end;

u=the closest integer to the quotient of k and (n−2); r=remainder: k/(n−2)=u+r/(n−2) or k=u(n−2)+r;

S(i)=disjoint subsets of S (i=1, . . . , n−1) whose union equals S (Step 4b);

S={S(1), S(2), . . . , S(n−1)};

"association" subsets are formed from S(i) by including the logic cones generated during backtracing (step 5a);

S*(i)=association subset created from S(i) by including its logic cones, (steps 5a and 5b);

S*={S*(1), . . . , S*(n−1)}=master association set, S* is electrically equivalent to the original circuit (step 5d);

T*(i)=testbench association subset for S*(i)=all ETFFs in S*(i) with N1 ON and their associated logic cones (step 5d);

T*=master testbench association set =all ETFFs with N1 ON and their associated logic cones=input periphery;

X(i)=fence subset={D(i,1), D(i,2), . . . , D(i,λ)}where each D(i,j) is an exterior ETFF in X(i)⊆R(i)⊆S(i)⊂S (i= 1, . . . , n−1), and λ is integer less than the number of elements in S(i);

X*(i)=association set of X(i)={all D(i,j) in X(i) and their associated logic cones};

T*=testbench association set=all elements of T' and their associated logic cones (merged with the testbench);

O*(i)={"output periphery"logic elements of X*(i)} which are merged with the testbench;

Y(i)=S*(i) U O*(i)=completion set formed from S*(i) and its output periphery;

P(i)=the netlist module formed from X(i);

P={P(1), P(2), . . . , P(n)} is the desired partition.

2. Create Data Structure, Control Bits

2a. Implement a data structure with s cells (one for each circuit element), and store each circuit element in the flattened input design, including its timing and connectivity information, one element in each of the s cells. See FIG. 8 ("Data Structure for Simulation Model"). Blocks of asynchronous logic and blocks of analog circuitry are treated as single-circuit-element "black boxes," and are stored in their own unique locations in the data structure, along with their port information.

2b. In each cell of the data structure create four control bits: N1 (input periphery), N2 (backtrace), N3 (exterior ETFF's) and N4 (output periphery), each initially OFF.

3. Input Periphery Preprocessing and Forward Trace

3a. Identify the primary inputs of the circuit that have interactions with the test bench and create a linked list. See FIG. 9.

3b. Forward trace from each relevant primary input until an ETFF is encountered, then stop forward tracing, turn that ETFF's control bit N1 ON, and add it to a linked list of ETFF's that will be placed in a single subset of the partition. Let N=the number of ETFF's with control bit N1. Treat asynchronous blocks and analog blocks as non-ETFF circuit elements.

3c. User adjustment of N. Let N'=the adjusted value of N. N'≧N. The default value is N.

4. Create and Subdivide the Master List S of ETFFs 4a-4b. Same as in the first embodiment. (Asynchronous logic blocks and blocks of analog circuits are not included in these steps.)

4c. There may be user interventions at this step to optimize placements of ETFFs in particular subsets to achieve load balancing, grouping by attributes, or other considerations.

Depending on how the asynchronous and analog blocks were modeled and represented in the data structure, how large they are, and on how the user desires to simulate these blocks, the user may choose to group the blocks by attributes.

5. Create Association Subsets S*(i) and Testbench Subsets T*(i); First Backtrace 5a. Take S(1) from Step 4b. Select any ETFF F(j) in S(1). Backtrace (see FIG. 5) from the input of F(j) creating a logic cone from F(j), stopping when an ETFF is encountered. Turn control bit N2 ON when any circuit element (including asynchronous and analog blocks) is encountered during the backtrace, including the beginning and terminating ETFFs. All circuit elements encountered during a backtrace are assigned to S(1) such that no circuit element (or asynchronous or analog block) is ever divided between subsets. Repeat for every ETFF in S(1).

5b-5e. Same as in the first embodiment. (Asynchronous logic blocks and blocks of analog circuits are not included in these steps.)

6. Create Fence Subsets X(i) and Output Periphery, Second Backtrace

6a. Same as in the first embodiment. (Asynchronous logic blocks and blocks of analog circuits are not included in this step.)

6b. Identify all circuit elements (including asynchronous and analog blocks), primary inputs and primary outputs of the association subset S*(1).

6c. Backtrace from the primary outputs of S*(1), turning control bits N2 and N4 ON each time a circuit element (including asynchronous and analog blocks) is encountered, and terminating when an ETFF is first encountered.

6d-6h Same as in the first embodiment. (Asynchronous logic blocks and blocks of analog circuits are not included in these steps.)

7. Create Partition Modules; Post-processing

7a. From the subset Y(1) in Step 6e, and the information in the data structure, form a module and write the result to an output file, creating the netlist for Y(1). This yields the netlist module P1.

7b. Iterate Step 7a n times, once for each subset Y(i). Completion of this step yields n separate netlist files (modules). P(n) derives from T*, and is merged with the testbench. P={P(1), P(2), . . . , P(n)} is the desired partition.

7c. Implement clock (CLK) inputs. The CLK inputs drive the fences X(i), isolating each subset of P. When all the simulators have finished their simulation cycle, an active CLK edge is generated in order to initiate the next transfer of logic values between subsets.

8. Simulation

8a. Load each partition subset P(1), P(2), . . . , P(n) onto n networked computers, one subset per computer, with each computer having access to its own appropriate type of simulator and sufficient memory compared to the size of the P(i).

8b. Collect and merge the results from the individual simulations, and present them as if the whole process had occurred on a single event-driven simulator running on a single CPU.

Fourth Embodiment (Behavioral, RTL)

As illustrated schematically in FIG. 1, an electronic system on a printed circuit board is expanded to show its integrated circuits as sub-systems, which are further expanded into macrocells which, in level 4, are shown both as gates and as a behavioral description. The first three embodiments described the application of the invention to cell level representations of the electronic design, and started by identifying the ETFF's and performing a backtrace from each of them.

The fourth embodiment of the present invention does not require operating at the cell level, and can perform a partition starting from a behavioral language or RTL description. The ETFF's will be represented by such statements as "@(posedge)" or "@(negedge)" in a behavioral or RTL-level description, as illustrated in FIG. 6. This identification permits the same algorithms as described in the first, second and third embodiments to be applied, in the same manner as described above. As in the other embodiments, a cell library or other timing data may be available.

Fifth Embodiment

The procedures of the first four embodiments are combined into a single embodiment capable of handling input designs of any size, with any number of clocks, and with asynchronous and analog blocks. The input design may be decomposed into any desired number of subsets; may be decomposed into subsets of any desired size; may operate with mixed levels of design hierarchy.

Other Embodiments

1. As illustrated in FIG. 1, the invention may be applied to electronic systems larger than a single integrated circuit.

2. The input design to be partitioned may have within it one or more functional blocks. In embodiments, the user may desire to "pre-partition" all or part of the design along functional boundaries, and this may be applied to each of the functional partitions to produce a simulation-ready partition incorporating the advantages of both methods (i.e., partitioning along functional boundaries and the current invention).

3. The input design to be partitioned may have more than one clock. In embodiments, the user may desire to "pre-partition" all or part of the design along clock boundaries, and this may be applied to each of the time-domain subsets to produce a simulation-ready partition incorporating the advantages of both methods (i.e., partitioning along clock boundaries and the current invention).

4. The embodiments outlined in 2 and 3 above may be combined, i.e., the user may employ pre-partitioning along functional, clock or other boundaries, and then apply the current invention to the sub-circuits obtained by pre-partitioning.

5. All of the embodiments may be used to provide subsets of a size pre-determined by the user (rather than starting with a pre-determined number of computers n). A first estimate (of the number of machines required for simulation) is obtained by dividing the number of circuit elements (s) by the desired number of circuit elements in each subset. The method of the invention is then used iteratively, with fine-tuning of the subsets under the control of the user.

6. Embodiments may be used in conjunction with multi-processor computers and multi-core processors, hardware emulation systems, hardware acceleration systems, as well as with parallel processing and multi-threading techniques.

7. Selected embodiments employ the steps of input periphery identification; isolation of testbench elements; identification of all ETFFs, their separation into "external" and "internal," and their use as starting points for backtracing; creation of the fence subsets; and output periphery extraction. There are several possible reorderings of the steps described that will create subsets with the same characteristics.

Headings are included herein for reference and to aid in locating certain sections. These headings are not intended to limit the scope of the concepts described under them, which concepts may have applicability in other sections throughout this entire document.

Simulation results of each embodiment may be presented (e.g., displayed, printed) for review by a user/operator.

This document describes in considerable detail the inventive apparatus, methods, and articles of manufacture for performing circuit simulations. This was done for illustration purposes only. Neither the specific embodiments of the invention as a whole, nor those of its features limit the general principles underlying the invention. The specific features described herein may be used in some embodiments, but not in others, without departure from the spirit and scope of the invention as set forth herein. Various physical arrangements of components and various step sequences also fall within the intended scope of the invention. Many additional modifications are intended in the foregoing disclosure, and it will be appreciated by those of ordinary skill in the art that in some instances some features of the invention will be employed in the absence of a corresponding use of other features. The illustrative examples therefore do not define the metes and bounds of the invention and the legal protection afforded the invention, which function is carried out by the claims and their equivalents.

I claim:

1. A computer-based method of simulating an integrated circuit design in a testbench, the method comprising:
   read in netlist and timing data for the design;
   flatten the design, thereby obtaining a flattened design;
   store a data structure in a computer readable medium, the data structure comprising a plurality of cells, one cell per circuit element of the flattened design, each cell of the plurality of cells comprising timing and connectivity information for the circuit element associated with said each cell, said each cell further comprising an input periphery (N1) control bit, a backtrace (N2) control bit, an exterior (N3) control bit, and an output periphery (N4) control bit;
   identify, from the information in the data structure, one or more primary inputs of the circuit design, each primary input of the one or more primary inputs having direct interaction with the testbench;
   forward trace from said each primary input until an edge triggered flip-flop (ETFF) is encountered;
   for said each primary input, turn on the N1 control bit of the ETFF encountered in the step of forward tracing from said each primary input, thereby obtaining a plurality of N ETFFs reachable from the primary inputs and having the N1 control bit turned on;
   for said each primary input, add the ETFF encountered in the step of forward tracing from said each primary input to a first linked list of ETFFs to be placed in a single subset;
   select N', N' being greater than or equal to N;
   create a master list S of all ETFFs in the data structure, the master list S comprising a first group of ETFFs of the circuit design and a second group of ETFFs of the circuit design, the first group of ETFFs comprising all ETFFs having N1 control bit turned off, the second group of ETFFs comprising all ETFFs in the first linked list, each ETFF of the first group preceding all the ETFFs in the second group in the master list S, the master list S comprising M ETFFs;
   divide the master list into (n−1) primary subsets {S(1), S(2), ..., S(n−1)} so that S(n−1) comprises all ETFFs of the second group, and remaining primary subsets are created by substantially equal division of ETFFs of the first group;

for each ETFF in each primary subset of the (n−1) subsets, first backtrace from an input of said each ETFF in said each primary subset stopping when another ETFF is encountered, wherein N2 control bit is turned on in every element encountered during first backtracing including said each ETFF in said each primary subset and the encountered ETFF, assigning all circuit elements encountered during the first backtracing to said each primary subset, wherein no circuit element is divided between the primary subsets;

for said each primary subset,
    create a corresponding association set that includes said each primary subset and logic cones of said each primary subset, and
    create a corresponding testbench subset by identifying all ETFFs in the corresponding association set with the N1 control bit turned on and logic cones of said all ETFFs in the corresponding association set with the N1 control bit turned on;

create a master association set S* by merging all the association sets;

create a master testbench association set T* by merging all the testbench subsets;

turn on the N3 control bit of each exterior ETFF in the circuit design;

for said each primary subset,
    form a corresponding fence subset, wherein the corresponding fence subset comprises all ETFFs of said primary subset with the N3 control bit turned on, second backtrace from primary inputs of the association set corresponding to said each primary subset until an ETFF is encountered, turning the N2 and N4 control bits on for each circuit element encountered during the second backtracing, create a Q subset corresponding to said each primary subset, the Q subset corresponding to said each primary subset comprising all elements of the association set corresponding to said each primary subset with the N4 control bit on, and create a completion subset corresponding to said each primary subset by union of (1) association set corresponding to said each primary subset and (2) the Q subset corresponding to said each primary subset;

for each completion set, create a corresponding netlist module, thereby obtaining a plurality of netlist modules;

implement clock (CLK) inputs to the plurality of netlist modules;

load each netlist module of the plurality of netlist module onto a different computer of a plurality of networked computers, each networked computer of the plurality of networked computers configured to have access to a different memory and a different circuit simulator;

simulate said each netlist module on the computer associated with said each netlist module;

merge results of the step of simulating, thereby obtaining merged simulation results; and provide user access to the merged simulation results.

* * * * *